CLOSED LOOP LOGIC GATE MULTIPLE PHASE CLOCK SIGNAL GENERATOR

Original Filed Dec. 30, 1968 2 Sheets-Sheet 1

INVENTOR
GARY L. HEIMBIGNER
BY Robert G. Rogers
ATTORNEY

INVENTOR
GARY L. HEIMBIGNER
BY Robert G. Rogers
ATTORNEY

United States Patent Office

Re. 27,394
Reissued June 20, 1972

27,394

CLOSED LOOP LOGIC GATE MULTIPLE PHASE CLOCK SIGNAL GENERATOR

Gary L. Heimbigner, Anaheim, Calif., assignor to North American Rockwell Corporation Original No. 3,539,938, dated Nov. 10, 1970, Ser. No. 787,719, Dec. 30, 1968. Application for reissue May 27, 1971, Ser. No. 147,556
Int. Cl. H03k *3/02*
U.S. Cl. 331—57 10 Claims

Matter enclosed in heavy brackets [ ] appears in the original patent but forms no part of this reissue specification; matter printed in italics indicates the additions made by reissue.

ABSTRACT OF THE DISCLOSURE

Output signals from the logic gates of an oscillator circuit represent sequential digital *states* [stagtes]. Output signals having certain related intervals are combined as inputs to the logic gates to produce multiple phase clock signals having a desired symmetry and relationship without the necessity for decode logic at the output of the oscillator.

BACKGROUND OF THE INVENTION

Field of the invention

The invention relates to a multiple phase clock signal generator and more particularly to such a generator in which certain signals of the generator are selectively combined within the generator to produce the multiple phase clock signals without the necessity for decode logic.

Description of prior art

Ordinarily clock signals are generated by decode logic at the outputs of a particular counter. Counts from the counter are decoded by gates equivalent to the number of signals desired to produce clock signals having a desired symmetry and relationship. For example, it may be desired to produce consecutive clock signals which have a true interval of two bit times. In other systems, it may be required to have the true intervals separated by an interval equal to one bit time. In still other systems, it may be required for the consecutive clock signals to have true intervals which overlap symmetrically.

While a counter with decode logic provides usable clock signals, such a system requires more logic gates than necessary and, therefore, utilizes more space and consumes more power than would be preferred. In a preferred system, the outputs of gates used in generating signals representing sequential and recurring logic states would be used to produce the desired clock signals without the necessity for decode logic. The number of gates, including their inputs and output connections, would be a function of the type of clock signals required.

SUMMARY OF THE INVENTION

Briefly, the invention comprises a multiphase clock generator having a plurality of logic gates forming an oscillator for generating signals each of which has sequential and recurring intervals representing true and false logic states. The corresponding logic states of each signal have different beginning and ending phase times. The outputs of certain of the logic gates are connected as inputs to others of the logic gates for controlling the phase spacing and overlap between the signals.

Therefore, it is an object of this invention to provide an improved multi-phase clock signal generator.

It is another object of this invention is produce clock signals directly from logic gates forming an oscillator without the necessity for decode logic.

Another object of the invention is to generate clock signals having a predetermined phase relationship and symmetry directly from gates of an oscillator which are gated by signals generated within said oscillator.

It is still another object of this invention to provide a number of gates interconnected to form an oscillator as a function of required output signals from said gates.

Still another object of this invention is to provide multiple phase clock signals directly from an oscillator circuit having the required phase spacing and overlap.

These and other objects will become more apparent when taken in connection with the description of drawings, a brief description of which follows.

DESCRIPTION OF THE PREFERRED EMBODIMENTS

Figure 1:
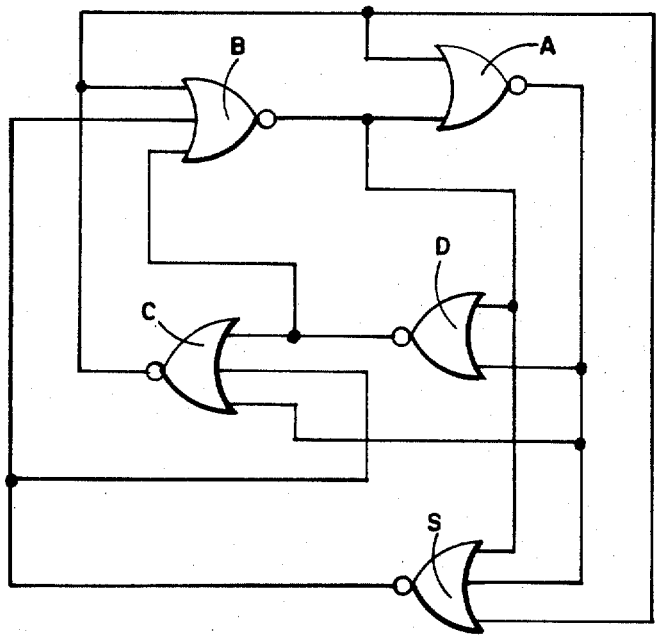
FIG. 1 represents one embodiment of a clock signal generator for producing clock signals having a phase separation of one bit time, a true interval of three bit times, and an overlapping interval of one bit time.

FIG. 1 illustrates a simple embodiment of a closed loop logic gate multiple phase clock signal generator comprising NOR gates A thru D and S for generating clock signals conforming to the following bit pattern and logic equation.

TABLE I

| D | C | B | A | |
|---|---|---|---|---|
| 1 | 0 | 0 | 1 | $A=\overline{B+C}$ |
| 0 | 0 | 0 | 1 | $B=\overline{C+D+S}$ |
| 0 | 0 | 0 | 1 | $C=\overline{D+A+S}$ |
| 0 | 0 | 1 | 0 | $D=\overline{A+B}$ |
| 0 | 1 | 0 | 0 | $S=\overline{A+B+C}$ |
| 0 | 1 | 0 | 0 | |
| 1 | 1 | 0 | 0 | |
| 1 | 0 | 0 | 0 | |

TABLE I

| D | C | B | A | |
|---|---|---|---|---|
| 1 | 0 | 0 | 1 | $A=\overline{B+C}$ |
| 0 | 0 | 0 | 1 | $B=\overline{C+D+S}$ |
| 0 | 0 | 1 | 1 | $C=\overline{D+A+S}$ |
| 0 | 0 | 1 | 0 | $D=\overline{A+B}$ |
| 0 | 1 | 1 | 0 | $S=\overline{A+B+C}$ |
| 0 | 1 | 0 | 0 | |
| 1 | 1 | 0 | 0 | |
| 1 | 0 | 0 | 0 | |

As indicated by the bit pattern, the output clock signal from NOR gate A has a true interval of three bit times and a false interval of five bit times. The A and C true intervals are separated by one bit time as are the B and D true intervals. The A & B, B & C, C & D, and D & A signals overlap by one bit time.

The S NOR gate is used to establish initial output conditions on NOR gates B and C for generating the required bit pattern. After the initial conditions are set, the generator runs freely as an oscillator.

In the usual case, prior to implementing a bit pattern generator, the required characteristics of a set of clock signals are determined. For example, the above bit pattern and corresponding logic were developed for a two-phase clocking scheme in which it was required that certain of the signals have a one bit spacing. In order to provide signals having a one bit spacing, it was necessary as shown, to reduce the "ON" interval, or true time of the signals by one bit. As a result, the clock signals are on for three bit times and off for five bit times.

Generally, multiphase clock signals used in gating multiphase logic should have a phase relationship including an isolation or separation period to prevent race conditions from occurring. If an isolation interval is not provided, it would be possible to gate information through a combination of gates without the required delay. In other words, information may arrive at an output terminal from multiphase logic gates prior to the time it is required. As a result, errors could occur.

The phase relationship between signals should also provide for an overlap between adjacent phases of the clock signals so that capacitors comprising a logic circuit can be properly charged and discharged at a relatively high rate of speed. Without the overlap, time would be lost between the true time of one clock signal and the true time of an adjacent clock signal used in gating the same logic circuit. Charge splitting is also prevented by using overlapped clock signals. The overlap period is determined somewhat by the characteristics of the circuit being gated. In some circuits, a large overlap is required; while in others, a small overlap is acceptable. [Obviously, the clock signals should have symmetrical true intervals and symmetrical false intervals.]

After the number of clock signals and their logical relationship have been determined, gates for implementing the logic can be produced and interconnected as required. The resulting combination of gates produces an oscillator circuit which generates signals corresponding to a bit pattern as a function of the requirements of the output clock signals.

As shown in FIG. 1, four NOR gates (plus a starting NOR gate) are required to implement the logic and bit pattern shown in Table I. The output signals from each of the gates have sequential intervals representing two logical states (true and false) represented by the ones and zeros shown. Corresponding logic states of each output signal have different beginning and ending phase times although the intervals of the corresponding logic states are equal.

The phase relationship (spacing and overlap) of the output signals is determined by the input signals. For example, since the output from NOR gate A goes true one bit time after the outputs from NOR gates C and B are both false, those output signals can be used to drive the A NOR gate output true. One bit after the C and B outputs are no longer both false, the A gate is driven false. Similarly, since the B gate goes true one bit time after both the D and C outputs are false, those outputs can be used to drive NOR gate B true. NOR gate B remains true until both of the signals are not false, i.e., three bit times later. Other relationships should be obvious from the logic and bit pattern shown in Table I.

The FIG. 1 scheme could be used for a $4\phi$ scheme, although it would not be as useful because of the small overlap between signals.

Figure 2:
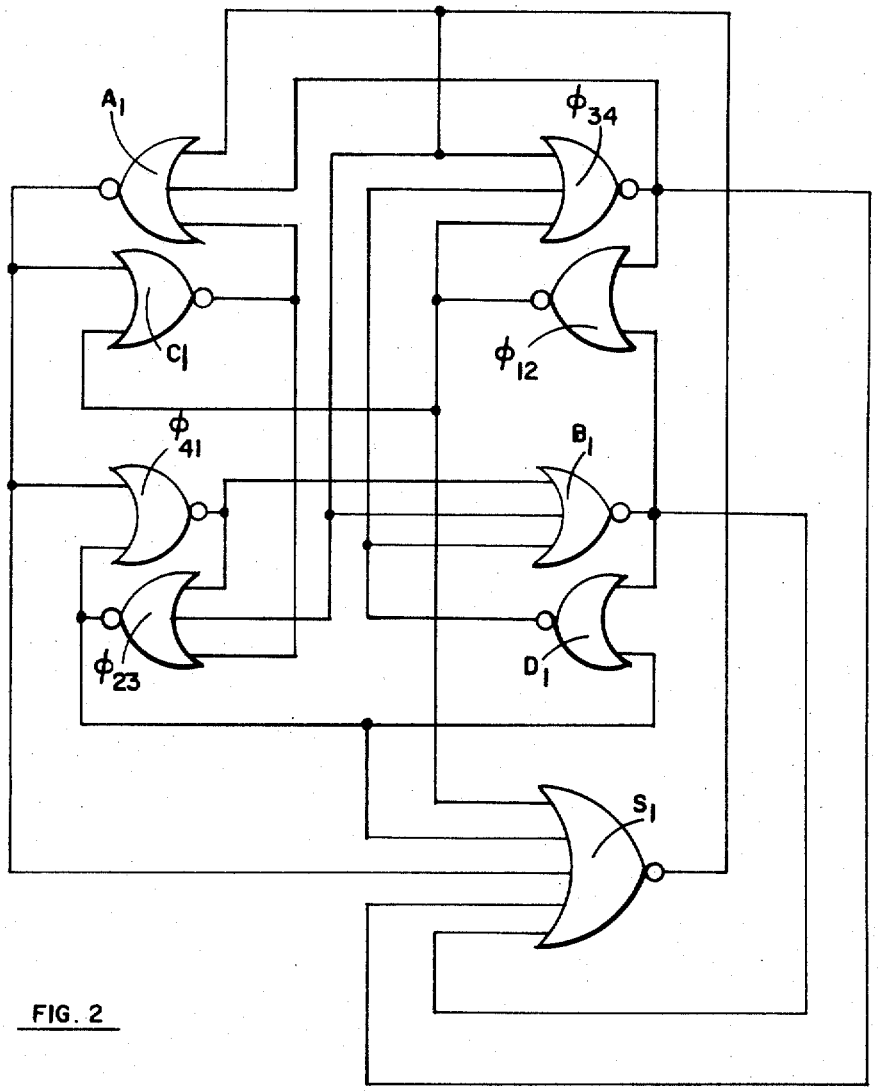
FIG. 2 represents a second embodiment of a clock signal generator for producing clock signals having a phase separation of one bit time, a true interval of seven bit times, and an overlapping interval of three bit times.

A more practical multiphase clock signal generator, useful for high speed gating, is shown in FIG. 2. The bit pattern produced by the FIG. 2 embodiment is set forth below as is the logic implemented by the NOR gates identified as $A_1$, $B_1$, $C_1$, $D_1$, $S_1$, $\phi_{12}$, $\phi_{23}$, $\phi_{34}$, and $\phi_{41}$.

TABLE II

| $D_1$ | $\omega_{41}$ | $C_1$ | $\varphi_{34}$ | $B_1$ | $\varphi_{23}$ | $A_1$ | $\varphi_{12}$ | |
|---|---|---|---|---|---|---|---|---|
| 1 | 1 | 1 | 0 | 0 | 0 | 0 | 1 | |
| 1 | 1 | 0 | 0 | 0 | 0 | 0 | 1 | $\varphi_{12}=\overline{B_1+{}_{34}\varphi}$ |
| 1 | 1 | 0 | 0 | 0 | 0 | 1 | 1 | $A_2=\overline{\varphi_{34}+C_1+S_1}$ |
| 1 | 0 | 0 | 0 | 0 | 0 | 1 | 1 | |
| 1 | 0 | 0 | 0 | 0 | 1 | 1 | 1 | $\varphi_{23}=\overline{C_1+\varphi_{41}+S_1}$ |
| 0 | 0 | 0 | 0 | 0 | 1 | 1 | 1 | |
| 0 | 0 | 0 | 0 | 1 | 1 | 1 | 1 | $B_1=\overline{\varphi_4+D+S_1}$ |
| 0 | 0 | 0 | 0 | 1 | 1 | 1 | 0 | |
| 0 | 0 | 0 | 1 | 1 | 1 | 1 | 0 | $\varphi_{34}=\overline{D+\varphi_{12}+S_1}$ |
| 0 | 0 | 0 | 1 | 1 | 1 | 0 | 0 | $C_1=\overline{\varphi_{12}+A_1}$ |
| | | | | | 1 | | | |
| 0 | 0 | 1 | 1 | 1 | 0 | 0 | 0 | $\varphi_{41}=\overline{A_1+\varphi_{23}}$ |
| | 0 | | | | | | | $D_1=\overline{\varphi_{23}+B_1}$ |
| 0 | 1 | 1 | 1 | 1 | 0 | 0 | 0 | |
| | | | | 1 | | | | $S=\overline{\varphi_{12}+A+\varphi_{23}+B+\varphi_{34}}$ |
| 0 | 1 | 1 | 1 | 0 | 0 | 0 | 0 | |
| 0 | | | | | | | | ${}_1\varphi=\overline{A_1+\varphi_{34}}$ |
| 1 | 1 | 1 | 1 | 0 | 0 | 0 | 0 | $\varphi_3=\overline{B_1+\varphi_{41}}$ |
| | | | 1 | | | | | |
| 1 | 1 | 1 | 0 | 0 | 0 | 0 | 0 | |
| | | 1 | | | | 0 | 0 | |

TABLE II

| $D_1$ | $\phi_{41}$ | $C_1$ | $\phi_{34}$ | $B_1$ | $\phi_{23}$ | $A_1$ | $\phi_{12}$ | |
|---|---|---|---|---|---|---|---|---|
| 1 | 1 | 1 | 0 | 0 | 0 | 0 | 1 | $\phi_{12}=\overline{B_1+\phi_{34}}$ |
| 1 | 1 | 0 | 0 | 0 | 0 | 0 | 1 | |
| 1 | 1 | 0 | 0 | 0 | 0 | 1 | 1 | $A_1=\overline{\phi_{34}+C_1+S_1}$ |
| 1 | 0 | 0 | 0 | 0 | 0 | 1 | 1 | |
| 1 | 0 | 0 | 0 | 0 | 1 | 1 | 1 | $\phi_{23}=\overline{C_1+\phi_{41}+S_1}$ |
| 0 | 0 | 0 | 0 | 0 | 1 | 1 | 1 | $B_1=\overline{\phi_{41}+D_1+S_1}$ |
| 0 | 0 | 0 | 0 | 1 | 1 | 1 | 1 | |
| 0 | 0 | 0 | 0 | 1 | 1 | 1 | 0 | $\phi_{34}=\overline{D_1+\phi_{12}+S_1}$ |
| 0 | 0 | 0 | 1 | 1 | 1 | 1 | 0 | |
| 0 | 0 | 0 | 1 | 1 | 1 | 0 | 0 | $C_1=\overline{\phi_{12}+A_1}$ |
| 0 | 0 | 1 | 1 | 1 | 1 | 0 | 0 | $\phi_{41}=\overline{A_1+\phi_{23}}$ |
| 0 | 0 | 1 | 1 | 1 | 0 | 0 | 0 | |
| 0 | 1 | 1 | 1 | 1 | 0 | 0 | 0 | $D_1=\overline{\phi_{23}+B_1}$ |
| 0 | 1 | 1 | 1 | 0 | 0 | 0 | 0 | |
| 1 | 1 | 1 | 1 | 0 | 0 | 0 | 0 | $S_1=\overline{\phi_{12}+A_1+\phi_{23}+B_1+\phi_{34}}$ |
| 1 | 1 | 1 | 0 | 0 | 0 | 0 | 0 | $\phi_1=\overline{A_1+\phi_{34}}$ |
| | | | | | | | | $\phi_3=\overline{B_1+\phi_{41}}$ |

As indicated above, the phase separation between clock signals $\phi_{12}$ and $\phi_{34}$ and between $\phi_{23}$ and $\phi_{41}$ is one bit time. The "ON" or true interval of each clock signal is seven bit times and the overlap period between clock signals $\phi_{12}$, $\phi_{23}$, $\phi_{34}$, and $\phi_{41}$, is three bit times. The subscripts are intended to represent adjacent intervals during which the output clock signals from the gates are true. For example, $\phi_{12}$ represents a signal that is true during 1 and 2 phase times. Therefore, a signal which is also true during 2 and 3 phase times will overlap the signal which is true during 1 and 2 phase time. Clock signals from the gates designated as $A_1$ through $D_1$, are necessary inputs to the other gates in order to generate output clock signals having the desired relationship, i.e., 1 bit separation and 3 bit overlap.

After the characteristics of required clock signals have been determined, as described in the previous paragraph, it may be necessary to add gates to the gates which produce the necessary clock signals in order to implement a generator having a capability for producing signals having a necessary bit pattern relationship. Gates represented $A_1$ through $D_1$, were added to produce the required bit configuration for generating clock signals $\phi_{12}$, $\phi_{23}$, $\phi_{34}$, $\phi_{41}$. For example, $\phi_{12}$ and $\phi_{34}$ have true periods which are separated by one bit. In order to produce the required bit separation, it was necessary that the clock signals have a bit pattern difference of two bits. In other words, $\phi_{12}$ and $A_1$ have logical intervals which have a phase displacement of two logic states. By inspecting the bit pattern, it can be seen that $\phi_{12}$ becomes true one interval (bit time) and $\phi_{34}$ and $B_1$ are false and that it remains true for one interval after $B_1$ becomes true. Therefore, $\phi_{34}$ and $B_1$ can be used as inputs to the $\phi_{12}$ gate to produce a signal which becomes false one bit before $\phi_{34}$ goes true for producing the required isolation. That is, when both inputs to [NO] *NOR* gate $\phi_{12}$ are false, one bit time later the output of $\phi_{12}$ goes true and remains true until both inputs are not false. When that occurs, the output goes false.

The output from the $S_1$ gate is necessary to establish initial conditions for the clock generator. Thereafter, the generator produces signals which repersent a recurring bit pattern having a configuration as a function of the desired clock signals. The $S_1$ gate receives inputs from gates $\phi_{12}$, $A_1$, $\phi_{23}$, $B_1$, and $\phi_{34}$ as shown.

Although NOR gates $\phi_{12}$ through $\phi_{41}$ were the necessary gates for a particular gating system, it is possible to decode the bit pattern represented by the output signals to produce, or generate, other clock signals. Examples of decode gates are represented by the $\phi_1$ and $\phi_3$ NOR gates. It should be pointed out, however that the major clock signals, $\phi_{12}$ through $\phi_{41}$ are produced without the necessity for decode logic.

Although the FIG. 2 system is the preferred embodiment since it is the most practical embodiment, oscillator circuits generating signals representing additional patterns may also be implemented. However, using the method described in connection with FIGS. 1 and 2 for overlaps in excess of three, the system becomes impractical to produce. An example of bit patterns produced by a generator having four major gates ($\phi_{12M}$, $\phi_{23M}$, $\phi_{34M}$, $\phi_{41M}$) with an "ON" time of 11 intervals and a bit time separation of one bit is shown by the following table and logic. Decode logic for the clock signals designated as minors ($\phi_{1m}$, $\phi_{2m}$, $\phi_{3m}$, $\phi_{4m}$) is also shown.

"OFF"), thru overlap intervals between adjacent signals, and one interval of separation between alternate signals. Based on that information, a bit pattern for major clock signals would be derived afterwards and the number of additional gates generating signals having similar characteristics could be added to complete this bit pattern for the generator. Although the invention has been described and illustrated in detail, it is to be understood that the same is by way of illustration and example only, and is not to be taken by way of limitation; the spirit and scope of this invention being limited only by the terms of the appended claims.

What is claimed is:

1. A closed loop logic gate multiple phase clock signal generator comprising two two-input logic gates and three three-input logic gates, a first of said two-input logic gates providing inputs to the second of said two-input logic gates, to a first and a second of said three-input logic gates.

said second two-input logic gate providing inputs to said second and a third of said three-input logic gates, said first three-input logic gate providing inputs to said second and third three-input logic gates,

TABLE III

| $H_h$ | $G_g$ | $\phi_{41M}$ | $F_f$ | $E_e$ | $\phi_{34M}$ | $D_d$ | $C_c$ | $\phi_{23M}$ | $B_b$ | $A_a$ | $\phi_{12M}$ | |
|---|---|---|---|---|---|---|---|---|---|---|---|---|
| 1 | 1 | 1 | 1 | 1 | 0 | 0 | 0 | 0 | 0 | 0 | 1 | $\phi_{12M}=\overline{D_d+\phi_{34M}}$ |
| 1 | 1 | 1 | 1 | 0 | 0 | 0 | 0 | 0 | 0 | 0 | 1 | $A_a=\overline{\phi_{34M}+E_e+S_s}$ |
| 1 | 1 | 1 | 1 | 0 | 0 | 0 | 0 | 0 | 0 | 1 | 1 | $B_b=\overline{E_e+F_f+S_s}$ |
| 1 | 1 | 1 | 0 | 0 | 0 | 0 | 0 | 0 | 0 | 1 | 1 | $\phi_{23M}=\overline{F_f+\phi_{41M}+S_s}$ |
| 1 | 1 | 1 | 0 | 0 | 0 | 0 | 0 | 0 | 1 | 1 | 1 | $C_c=\overline{\phi_{41M}+G_J+S_s}$ |
| 1 | 1 | 0 | 0 | 0 | 0 | 0 | 0 | 0 | 1 | 1 | 1 | $D_d=\overline{G_J+H_b+S_s}$ |
| 1 | 1 | 0 | 0 | 0 | 0 | 0 | 0 | 1 | 1 | 1 | 1 | $\phi_{34M}=\overline{H_h+\phi_{12M}+S_s}$ |
| 1 | 0 | 0 | 0 | 0 | 0 | 0 | 0 | 1 | 1 | 1 | 1 | $E_e=\overline{\phi_{12M}+A_a}$ |
| 1 | 0 | 0 | 0 | 0 | 0 | 0 | 1 | 1 | 1 | 1 | 1 | $F_f=\overline{A_a+B_b}$ |
| 0 | 0 | 0 | 0 | 0 | 0 | 0 | 1 | 1 | 1 | 1 | 1 | $\phi_{41M}=\overline{B_b+\phi_{23M}}$ |
| 0 | 0 | 0 | 0 | 0 | 0 | 1 | 1 | 1 | 1 | 1 | 1 | $G_J=\overline{\phi_{23M}+C_c}$ |
| 0 | 0 | 0 | 0 | 0 | 0 | 1 | 1 | 1 | 1 | 1 | 0 | $H_h=\overline{C_c+D_d}$ |
| 0 | 0 | 0 | 0 | 0 | 1 | 1 | 1 | 1 | 1 | 1 | 0 | $S_b=\overline{\phi_{12M}+A_a+B_b+\phi_{23M}+C_c+D_d+\phi_{34M}}$ |
| 0 | 0 | 0 | 0 | 0 | 1 | 1 | 1 | 1 | 1 | 0 | 0 | |
| 0 | 0 | 0 | 0 | 1 | 1 | 1 | 1 | 1 | 1 | 0 | 0 | |
| 0 | 0 | 0 | 0 | 1 | 1 | 1 | 1 | 1 | 0 | 0 | 0 | |
| 0 | 0 | 0 | 1 | 1 | 1 | 1 | 1 | 1 | 0 | 0 | 0 | |
| 0 | 0 | 0 | 1 | 1 | 1 | 1 | 1 | 0 | 0 | 0 | 0 | |
| 0 | 0 | 1 | 1 | 1 | 1 | 1 | 1 | 0 | 0 | 0 | 0 | |
| 0 | 0 | 1 | 1 | 1 | 1 | 1 | 0 | 0 | 0 | 0 | 0 | |
| 0 | 1 | 1 | 1 | 1 | 1 | 1 | 0 | 0 | 0 | 0 | 0 | |
| 0 | 1 | 1 | 1 | 1 | 1 | 0 | 0 | 0 | 0 | 0 | 0 | |
| 1 | 1 | 1 | 1 | 1 | 1 | 0 | 0 | 0 | 0 | 0 | 0 | |
| 1 | 1 | 1 | 1 | 1 | 0 | 0 | 0 | 0 | 0 | 0 | 0 | |

$\phi_{1M}=\overline{B_b+\phi_{34M}}$ $\phi_{3M}=\overline{F_f+\phi_{12M}}$ $\phi_{2M}=\overline{D_d+\phi_{41M}}$ $\phi_{4M}=\overline{H_h+\phi_{23M}}$ As indicated above, as the periods of overlap increase, the number of gates required to implement a clock generator also increases. For example, excluding the S gate, for an overlap of three bits, as shown in FIG. 2, eight gates were required. However, for an overlap of five bits, as shown in the above table, 12 gates were required. For an overlap of seven bits, 16 gates would be required. Obviously, therefore, as the requirements for overlap between signals increase, the number of gates also increases to the point where a system is impractical to produce.

In all the cases described, and in other cases, the multiphase clock generator conforms to the following equations:

4n=number of gates required (excluding S gate);
8n=number of oscillator states;
4n-1=number of states in "ON" period;
2n-1=number of states of overlap between adjacent signals;
1=number of states of isolation between [alttrnate] *alternate* signals;
2n-1=number of states in a minor phase (if decoded);
where n=any positive integer.

As indicated above, when n=2, eight gates are required with sixteen logic states (seven "ON" and nine said second three-input logic gate providing inputs to said first and third three-input logic gates and to said first two-input logic gate, said third three-input logic gate providing inputs to said first and second two-input logic gates, and to said first three-input logic gate.

2. The closed loop gate multiple phase clock signal generator recited in claim 1 wherein said first three-input logic gate receives said inputs and provides an output for establishing initial operating conditions of said clock generator.

[3. A closed loop logic gate multiple phase clock signal generator comprising:

five two-input logic gates, three three-input logic gates and one five-input logic gate, said second three-point-logic gate providing inputs to said five-input logic gate, a first of said three-input logic gates, and a second of said two-input logic gates, said second of said two-input logic gates providing inputs to a second of said three-input logic gates and to a third of said two-input logic gates, said third of said two-input logic gates providing inputs to said five-input logic gate, to a fourth of said two-input logic gates and to a third three-input logic gate, said fourth of said two-input logic gates providing inputs to said third and fifth two-input logic gates, said fifth two-input logic gate providing inputs to said first two-input logic gate, said third three-input logic gate, and to said five-input logic gate, said first three-input logic gate providing inputs to said second three-input logic gate and to said five-input logic gate, said second three-input logic gate providing inputs to said second and fourth two-input logic gates and to said five-input logic gate, said third three-input logic gate providing inputs to said fifth two-input logic gate and to said first three-input logic gate, said five-input logic gate providing inputs to said third three-input logic gate, said first two-input logic gate, said first three input logic gate, and said second three-input logic gate.]

4. The closed loop logic gate multiple phase clock signal generator recited in claim [3] *10* where said five-input logic gate receives said recited inputs and provides an output for establishing initial operating conditions of said clock generator.

5. The closed loop logic gate multiple phase clock signal generator recited in claim 4 wherein said logic gates are NOR gates.

6. The closed loop logic gate multiple phase clock signal generator recited in claim 4 wherein logic gates, excluding the gate for establishing initial operating conditions, are added to increase the multiple phase clock signals generated by said clock generator, the inputs to said five-input logic gate increasing as a function of the added logic gates, said number of logic gates being 4n where "n" is any positive integer greater than one.

7. The closed loop logic gate multiple phase clock signal generator recited in claim 6 wherein each gate, excluding the gate for establishing initial conditions, generates a multiple phase clock signal which is related to each other signal, with each adjacent signal having a fixed phase separation and with each alternate signal having a fixed phase overlap equal to 2n—1 phase intervals, where "n" is any positive integer greater than 1.

8. The closed loop logic gate multiple [phast] *phase* clock signal generator recited in claim 7 wherein each of said signals has a number of phase intervals equal to 8n where n is any positive integer greater than one, said phase intervals being divided between two logic levels with each signal remaining in a first logic level for a number of phase intervals equal to 4n—1, where n is any positive integer greater than one.

9. A closed loop logic gate multiple phase clock signal generator having a multiple input logic gate for establishing initial condition, said generator further including a plurality of multiple input logic gates 4n for generating multiple phase output signals each having 8n logic states, wherein each of said logic states comprises a first logic level and a second logic level with 4n—1 logic states of each signal being at said first logic level, certain of said plurality of said logic gates providing inputs to certain others of said plurality of logic gates until all logic gates are interconnected in a closed loop for providing a synchronized phase relationship between said multiple phase output signals, with output signals adjacent to each other in phase having a fixed phase separation and with the signals which are [alternatte] *alternate* to each other in phase having a phase overlap equal to 2n—1, and where n is any positive integer greater than one.

*10. A closed loop logic gate multiple phase clock signal generator comprising in combination:*

*first means comprising a five-input logic gate;*

*second means comprising four three-input logic gates;*

*third means comprising four two-input logic gates; wherein*

*said first means provides inputs to each of said second means, a first of said second means provides inputs to said first means and to a first and second of said third means, said first of said third means provides inputs to a second and third of said second means, said second of said third means provides inputs to said first and second of said second means, said second of said second means provides inputs to said first means to said first of said third means and to a third of said third means, said third of said second means provides inputs to said first means to said third of said third means and to a fourth of said second means, said third of said third means provides inputs to said first means to said third of said second means and to a fourth of said third means, said fourth of said second means provides inputs to said first means and to said second and fourth of said third means, and said fourth of said third means provides inputs to said first and fourth of said second means.*

*11. A closed loop logic gate multiple phase clock signal generator comprising:*

*a multiple input logic gate S for establishing initial conditions and 4n multiple input logic gates for generating multiple phase logic gating signals each having 8n combinational logic states, wherein 4n—1 of said logic states comprise a first logic level and the remainder a second logic level, said 8n logic states of said logic gating signal comprised of a first series of said logic level states followed sequentially by a second series of said second logic level states, with each series of said first logic level states of a particular logic gating signal preceding the series of said first logic level states of a subsequent logic gating signal by two state times,*

*the output of a series of said first logic level states being generated in a subsequent logic gating signal one state time after said second logic level pervades a set comprising different ones of said logic gates, said set unique to said subsequent logic gate, with output signals adjacent to each other in phase having a fixed phase delay, said series of said first logic level states of each logic gate separated by one state time from the said series of said first logic level states of at least one other of said 4n logic gates, said series of said first logic level states of each logic gate overlapping by 2n—1 state times the said series of first logic level states of one other of said 4n logic gates,*

*said logic gates being connected such that excluding the S gate, for a kth gate of said 4n gates the inputs to said kth gate are from gates numbered 2n+k, 2n+k—1, and from S if k is between 2 and 2n+1 inclusive, with 4n being subtracted from said 2n+k or 2n+k—1 if said 2n+k or 2n+k—1 exceeds 4n, said S gate inputs being from gate numbers 1 to 2n+1 inclusive where "n" is any positive integer, and "k" is any positive integer from 1 to 4n.*

References Cited

The following references, cited by the Examiner, are of record in the patented file of this patent or the original patent.

UNITED STATES PATENTS

| | | | |
|---|---|---|---|
| 3,110,821 | 11/1963 | Webb | 328—43 X |
| 3,235,796 | 2/1966 | Tarczy-Hornoch | 331—57 X |
| 3,350,659 | 10/1967 | Henn | 331—57 |
| 3,428,913 | 2/1969 | Pechoucek | 307—223 X |

ROY LAKE, Primary Examiner

S. H. GRIMM, Assistant Examiner

U.S. Cl. X.R.

328—60; 331—108 C, 135